United States Patent [19]

Onoguchi et al.

[11] Patent Number: 4,460,827
[45] Date of Patent: Jul. 17, 1984

[54] SCANNING ELECTRON MICROSCOPE OR SIMILAR EQUIPMENT WITH TILTABLE MICROSCOPE COLUMN

[75] Inventors: Akira Onoguchi, Chofu; Shigetomo Yamazaki, Hachioji, both of Japan

[73] Assignee: Kabushiki Kaisha Akashi Seisakusho, Tokyo, Japan

[21] Appl. No.: 337,101

[22] Filed: Jan. 5, 1982

[30] Foreign Application Priority Data

Feb. 6, 1981 [JP] Japan .................................. 56-16720

[51] Int. Cl.³ ............................................ H01J 37/00
[52] U.S. Cl. ................................... 250/310; 250/306; 250/441.1
[58] Field of Search ....................... 250/310, 306, 441.1

[56] References Cited

U.S. PATENT DOCUMENTS 2,215,979 9/1940 Schuchmann .................... 250/441.1
3,997,807 12/1976 Riddle et al. ....................... 250/306

Primary Examiner—Alfred E. Smith
Assistant Examiner—T. N. Grigsby

Attorney, Agent, or Firm—Robert E. Burns; Emmanuel J. Lobato; Bruce L. Adams

[57] ABSTRACT

The specification describes a scanning electron microscope or similar equipment having a tiltable microscope column so as to observe a specimen at different angles without inclining the specimen. In order to make the microscope column tiltable relative to its specimen chamber, an opening is formed through a wall portion of the specimen chamber. The opening is covered up by a movable cover. A lower portion of the microscope column extends through the cover into the specimen chamber. A sealing member is provided so as to surround the opening between the wall portion and cover to ensure the hermetic sealing therebetween. Since the microscope is tilted instead of inclining the specimen stage to obtain images of the specimen seen at different angles, the specimen stage can be simplified in both structure and mechanism. The specimen stage is thus kept stationary, resulting in a complete solution to vibrations caused by conventional specimen stages and in a substantial improvement to the resolution of scanning electron microscope and similar equipment.

8 Claims, 5 Drawing Figures

SCANNING ELECTRON MICROSCOPE OR SIMILAR EQUIPMENT WITH TILTABLE MICROSCOPE COLUMN

BACKGROUND OF THE INVENTION:

(1) Field of the Invention:

This invention relates to a scanning electron microscope or similar equipment, and more particularly to a scanning electron microscope or similar equipment provided with a tiltable microscope column so that a specimen can be observed at different angles without inclining the specimen. (2) Description of the Prior Art:

There have heretofore been known a wide variety of scanning electron microscope and similar equipments. For example, there is a scanning electron microscope as shown in FIG. 1, in which an electron beam emitted from an electron gun b in a microscope column a is imparted with a scanning movement by a deflection coil d, to which a scanning signal has already been fed from a scanning power supply power supply c, thereby causing the electron beam to irradiate a specimen e while scanning the same.

As the electron beam is irradiated onto the specimen e, secondary electrons or the like are given off from the specimen e and detected by a detector f. Then a resulting detection signal is amplified by an amplifier g and subsequently fed to a cathode ray tube h, where an image of the specimen e is displayed.

In FIG. 1, letters i and j indicate a condenser lens and objective lens respectively.

Recently such scanning electron microscope have been used widely to observe IC patterns formed on silicon wafers and to inspect the IC patterns.

Upon inspecting such IC patterns with a scanning electron microscope, it is required in some instances to observe the specimen e, for example, from an upper right or left point inclined by as much as 60° from the vertical direction. The inspection of an IC pattern formed on a silicon wafer as large as 6 inches in diameter or so has conventionally been carried out by inclining the wafer specimen e by 60° from the horizontal plane as illustrated in FIG. 1.

To make it possible to incline the specimen e, which may be as large as 6 inches in diameter, by as much as 60°, the specimen stage of a conventional scanning electron microscope or similar equipment is large in dimensions and complex in both structure and mechanism. Furthermore, the specimen stage is turned or moved in the X and Y directions while being in an inclined position, resulting in vibrations which in turn considerably lower its resolution and thus substantially deteriorate the accuracy and reliability of the pattern inspection work.

SUMMARY OF THE INVENTION

The present invention has been devised to solve such drawbacks of conventional scanning electron microscopes and similar equipment. Accordingly, an object of this invention is to provide a scanning electron microscope or similar equipment provided with a tiltable microscope column so that beams of charged particles can be irradiated onto a common specimen at different angles, thereby permitting the inspection of the specimen from oblique directions without need for inclining same.

In one aspect of this invention, there is thus provided a scanning electron microscope or similar equipment comprising a microscope column enclosing an irradiation system of charged particle beams and provided tiltably relative to the specimen chamber so as to irradiate the charged particle beams at different angles onto a common specimen placed in the specimen chamber, an opening formed in a wall portion of the specimen chamber, a movable cover permitting a base portion of the microscope column to hermetically extend therethrough and adapted to close the opening, and a sealing member interposed as to surround the opening between the wall portion of the specimen chamber and the movable cover.

BRIEF DESCRIPTION OF THE DRAWINGS:

In order that the invention may be clearly understood and readily carried into effect, a preferred embodiment thereof will now be described, by way of example only, with reference to the accompanying drawings of which.

DETAILED DESCRIPTION OF THE PREFERRED EMBODIMENT

Figure 1:
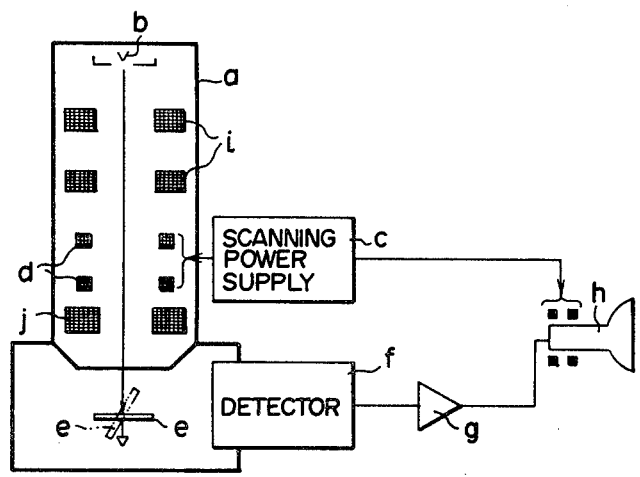
FIG. 1 is a simplified block diagram of a prior art scanning electron microscope.
Figure 2:
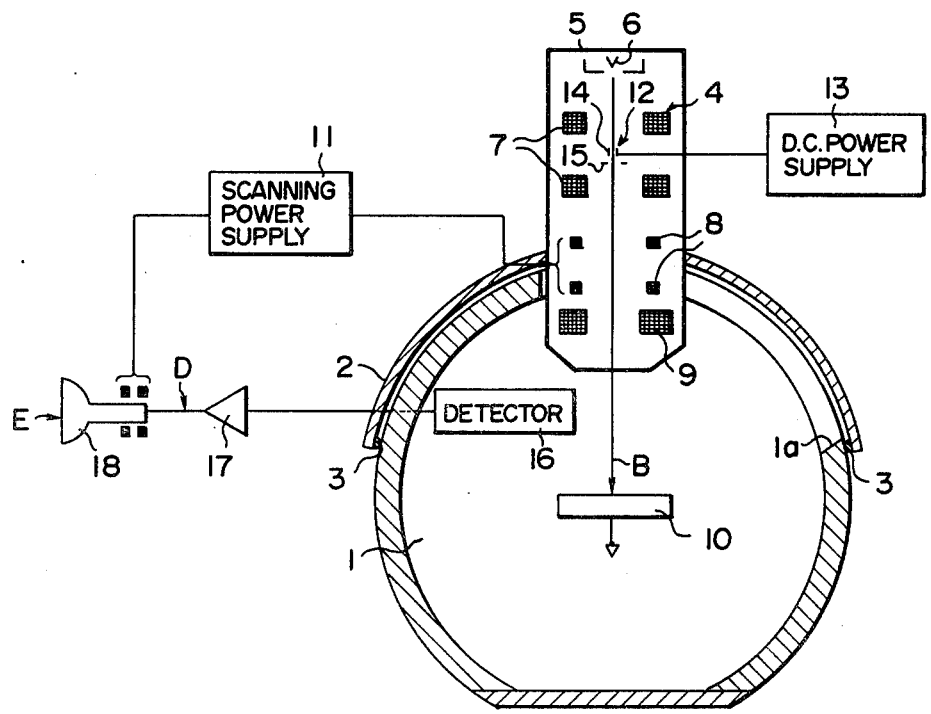
FIG. 2 illustrates a simplified block diagram of a scanning electron microscope provided with a tiltable microscope column according to the preferred embodiment of this invention, in which the microscope column is in its upright position.
Figure 3:
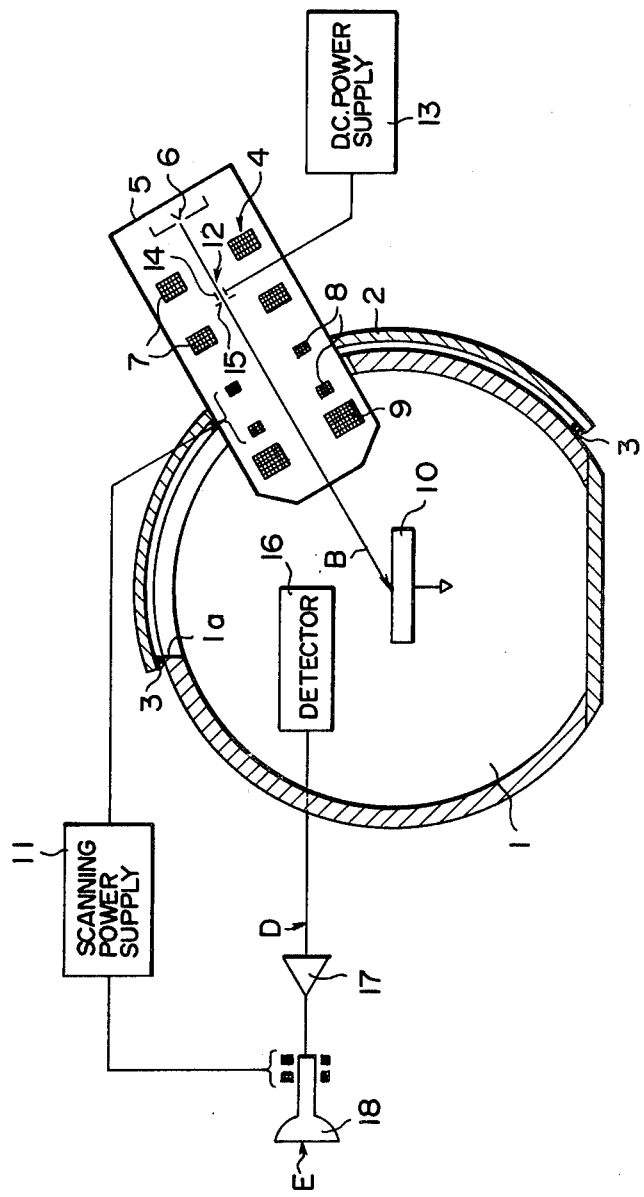
FIG. 3 is a simplified block diagram of the same electron microscope as illustrated in FIG. 2, but showing the microscope column in an inclined position.

As shown in the drawings, particularly, in FIGS. 2 and 3, and elongated opening 1a is formed through an upper wall portion of a specimen chamber 1.

The opening 1a is covered up by a cover 2, on the back surface of which cover is attached as a sealing member an O-ring 3, thereby hermetically closing the opening 1a in association with the cover 2. The cover 2 is provided in such a way that the cover 2 can be slidingly moved while maintaining the opening 1a covered up. During the sliding movement of the cover 2, the O-ring 3 is allowed to move while rubbing the peripheral edge of the opening 1a. The O-ring 3 may alternatively be provided along the peripheral edge of the opening 1a.

On the other hand, microscope column 5 enclosing therein an electron beam irradiation system 4 as an irradiation system of charged particle beams has a lower portion which extends through the cover 2 and is hermetically fixed to the cover, thereby allowing the lower portion of the irradiation system 4 to be inserted into the specimen chamber 1 through the cover 2.

Thus, upon moving the cover 2 either by moving the microscope column 5 or by other suitable means, the microscope column 5 can movably assume two positions, namely, an upright position as shown in FIG. 2 and an inclined position as illustrated in FIG. 3. Owing to such an arrangement, the microscope column 5 can be tiltingly moved relative to the specimen chamber 1.

As illustrated in FIG. 2, the cover 2 completely covers up, in a gastightly of hermatically sealed fashion, the opening 1a when the microscope column 5 is moved to assume its upright position. The opening 1a is also covered up completely in a gastigtly sealed state by means of the cover 2 when the microscope column 5 assumes the inclined position as depicted in FIG. 3 as well as any intermediate position between the two extreme positions shown in FIGS. 2 and 3.

The electron beam irradiation system 4 comprises an electron gun 6, upper and lower condenser lenses 7, deflection coils 8, objective lens 9, etc., all of which are provided in the microscope cylinder 5. The deflection coils 8 are provided respectively for deflection in the X-direction and Y-direction.

Since the microscope column 5 enclosing therein the electron beam irradiation system 4 is provided tiltably relative to the specimen chamber 1, the electron beam irradiation system 4 can assume different positions relative to the specimen chamber 1, thereby making it possible to irradiate an electron beam B from each of the positions onto the same surface spot on a specimen 10 placed on the specimen stage disposed in the specimen chamber 1.

The deflection coils 8 are fed with sawtooth wave-shaped signals for scanning in the X- and Y-directions from a scanning power supply 11, thereby causing electron beams to scan the specimen 10.

By the way, the electron beam irradiation system 4 is provided with a blanking system 12 which is capable of deflecting the electron beam B from the electron gun 6 and stopping the supply of the electron beam B onto the specimen 10.

The blanking system 12 is formed of a D.C. power supply 13 adapted to output D.C. signals, an electrostatic deflection member 14 connected with the D.C. power supply 13 via a switch(not illustrated) so as to deflect the electron beam B, for example, when the switch is closed, and a slit member 15 provided below the deflection member 14.

The deflection member 14 and slit member 15 are provided between the upper and lower condenser lenses 7. Furthermore, the deflection member 14 is disposed in the vicinity of the cross-over point of the electron beam B by the upper condenser lens 7. On the other hand, a slit is formed at the center of the slit member 15, which is grounded.

A detector 16 is provided in a wall portion of the specimen chamber 1 and is connected through an amplifier 17 to a cathode ray tube 18, thereby forming a detection unit D adapted to detect signals obtained through the irradiation of an electron beam onto the specimen 10 and coacting with a display unit E for displaying an image of the specimen 10 thereon upon receipt of signals from the detection unit D.

A scintillation detector may be employed as the detector 16. Although not shown in the drawings, the cathode ray tube 18 is provided additionally with a contrast and brightness regulator.

The deflection yoke of the cathode ray tube 18 is coupled with the scanning power supply 11 which supplies a saw-tooth wave signal for scanning the cathode ray tube 18, which signal is in synchronization with the scanning saw-tooth wave signal supplied to the deflection coil 8.

In such a construction as described above, in order to display both vertical and perspective images of the specimen 10, for example, a silicon wafer carrying an IC pattern formed thereon at the same surface spot thereof, the specimen 10 is first of all placed on the specimen stage in the specimen chamber 1 in such a state that the microscope column 5 is set in the upright position as depicted in FIG. 2.

Then, the specimen chamber 1 and microscope column 5 are evacuated to a vacuum state, followed by the irradiation of the electron beam B onto the specimen 10 from a point above the specimen 10. This causes secondary electrons or the like to be emitted from the specimen 10 and detected by the detector 16.

The resulting detection signal is amplified by the amplifier 17 and then supplied to the cathode ray tube 18. Here, the cathode ray tube 18 is operated synchronously with the scanning saw-tooth wave signal fed to the deflection coil 8 and the image of the surface spot of the specimen 10 seen from the location directly above the surface spot is display on the cathode ray tube 18.

Figure 4:
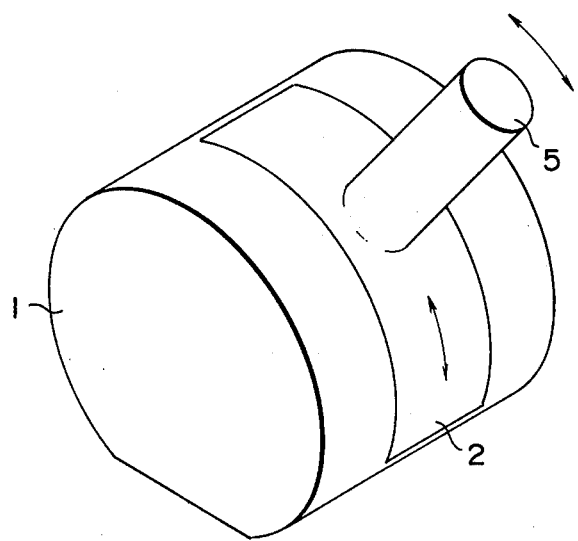
FIG. 4 is a perspective view schematically showing the external appearance of the same electron microscope.

Next, in order to display an image of the same surface spot on the specimen 10 seen from an upper oblique location, it is only necessary to slide the cover 2 so as to cause the microscope column 5 to assume the inclined position, as shown in FIGS. 3 and 4.

Here, the electron beam B may be kept irradiating onto the specimen 10. Alternatively, the blanking system 12 may be briefly actuated to stop the irradiation of the electron beam B onto the specimen 10 and then deactuated to permit the electron beam B to irradiate onto the specimen 10 again when the microscope column 5 has been set in the inclined position.

When the electron beam B is allowed to continuously irradiate onto the specimen 10 during a tilting movement of the microscope column 5 as in the former case, it is possible to observe successively-changing images of the specimen 10.

Since the electron beam B is irradiated onto the specimen 10 from a location oblique to the specimen 1 as mentioned above, secondary electrons or the like are emitted from the specimen 10 in response to this irradiation. They are detected by the detector 16 and, after amplification, are fed to the cathode ray tube 18, thereby displaying on the cathode ray tube 18 an image of the specimen 10 seen from an upper oblique location.

As has been described above, the present microscope allows the display of two different images of the specimen 10, one seen from a location directly above the specimen 10 and the other viewed from an upper oblique location, without inclining the specimen 10. Therefore, the present invention allows a substantial simplification of the structure of the specimen stage and, in addition, can also prevent the lowering of resolution due to vibrations Where the cover 2 is constructed in the form of a bellows, the sealing member is no longer required to move slidingly between the specimen chamber 1 and cover 2.

Figure 5:
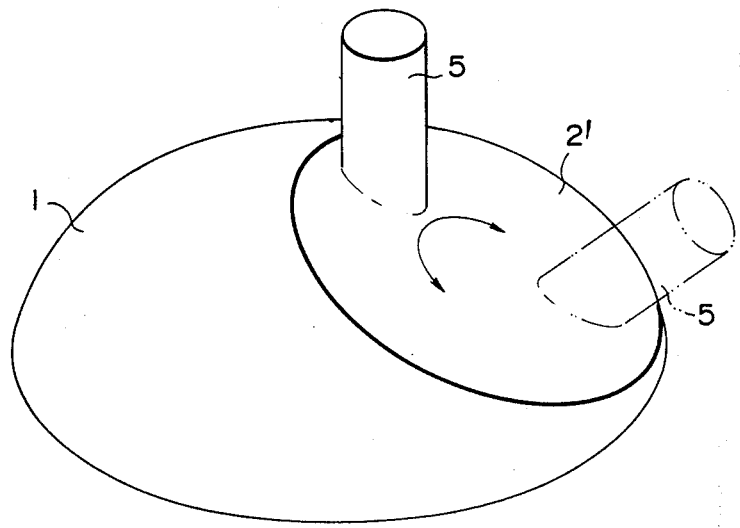
FIG. 5 is a perspective view schematically showing the external appearance of the scanning electron microscope provided with a tiltable microscope column according to another preferred embodiment of this invention.

Instead of tilting the microscope column 5 by virtue of a sliding movement of the elongated cover 2, it may be possible to employ for tilting the microscope column 5 means to turningly displace the microscope column 5 through the adoption of a circular cover 2' for mounting the microscope column 5 thereon as shown in FIG. 5.

Where such means is adopted, the adjustment of the contact surface of the O-ring 3 is relatively easy as the circular cover 2' is merely turned.

By the way, in the above-described embodiment, if information from the detector 16 is once stored in a memory, images of the specimen 10 seen from two directions can be reproduced and displayed simultaneously subsequent to obtaining both images. Here, one or two cathode ray tubes may be employed.

Although the present invention has been described above with a specific reference to scanning electron microscopes, it may similarly be applied to equipment similar to a scanning electron microscope, which equipment enables an observer to observe an image of a specimen by irradiating a charged particle beam such as ion beam onto the specimen.

Although the shape and size of the opening or movable cover may be determined suitably, it is preferred to form the opening as an elongated opening and the movable cover as long as at least twice the length of the elongated opening. On the other hand, as illustrated in FIG. 5, the movable cover may be formed into a circular shape and its corresponding opening may thus be formed into an arc shape.

As has been described in detail, in accordance with a scanning electron microscope or similar equipment provided with a tiltable microscope column of the present invention, the irradiation system of charged particle beams is provided tiltably relative to the specimen chamber and, owing to a simple construction that the hermetic sealing member is interposed between the wall portion of the specimen chamber at the periphery of the opening and the cover provided at the lower portion of the irradiation system of charged particle beams with the lower portion extending through the opening, it is possible to irradiate beams of charged particles onto the specimen disposed in the specimen chamber at different angles. Accordingly, the present invention can bring about such advantages that images of specimen seen at different angles may be display without inclining the specimen, thereby permitting to considerably simplify the structure of the specimen stage compared with conventional specimen stages and to greatly improve its resolution.

Having now fully described the invention, it will be apparent to one of ordinary skill in the art that many changes and modifications can be made thereto without departing from the spirit or scope of the invention as set forth herein.

What is claimed is:

1. A scanning electron microscope or similar equipment comprising: a specimen chamber for holding a specimen to be irradiated, a microscope column enclosing an irradiation system of charged particle beams and mounted to undergo tiltable movement relative to the specimen chamber so as to irradiate the charged particle beams at different angles onto a common specimen placed in said specimen chamber, an arc-shaped opening formed in a wall portion of said specimen chamber and through which extends a base portion of said microscope column, a movable cover closing said arc-shaped opening and being generally circular and through which hermetically extends the base portion of said microscope column, said movable cover being arcuately movable to enable said microscope column to be moved arcuately in said arc-shaped opening and tilted relative to said specimen chamber, and a sealing member interposed so as to surround said arc-shaped opening between said wall portion and said movable cover.

2. The scanning electron microscope or similar equipment as claimed in claim 1, further comprising a blanking system provided in said irradiation system of charged particle beams.

3. The scanning electron microscope or similar equipment as claimed in claim 2, wherein said blanking system comprises a D.C. power supply, a deflection member connected to said D.C. power supply through a switch, and slit member disposed below said deflection member.

4. The scanning electron microscope or similar equipment as claimed in claim 3, further comprising a pair of upper and lower condenser lenses provided in said irradiation system of charged particle beams, and wherein said deflection member and slit member are disposed between said upper and lower condenser lenses.

5. A scanning electron microscope or similar equipment comprising: a specimen chamber for holding a specimen to be irradiated, a microscope column enclosing an irradiation system of charged particle beams and mounted to undergo tiltable movement relative to the specimen chamber so as to irradiate the charged particle beams at different angles onto a common specimen placed in said specimen chamber, an elongated opening formed in a wall portion of said specimen chamber and through which extends a base portion of said microscope column, a movable cover closing said elongated opening and having a length at least twice the longitudinal direction length of said elongated opening and through which hermetically extends the base portion of said microscope column, said movable cover being slidably movable in the longitudinal direction of said elongated opening to enable said microscope column to be moved in said elongated opening and tilted relative to said specimen chamber, and a sealing member interposed so as to surround said elongated opening between said wall portion and said movable cover.

6. The scanning electron microscope or similar equipment as claimed in claim 5, further comprising a blanking system provided in said irradiation system of charged particle beams.

7. The scanning electron microscope or similar equipment as claimed in claim 6, wherein said blanking system comprises a D.C. power supply, a deflection member connected to said D.C. power supply through a switch, and a slit member disposed below said deflection member.

8. The scanning electron microscope or similar equipment as claimed in claim 7, further comprising a pair of upper and lower condenser lenses provided in said irradiation system of charged particle beams, and wherein said deflection member and slit member are disposed between said upper and lower condenser lenses.

* * * * *